United States Patent
Sugawara

[19]

[11] Patent Number: 6,054,897
[45] Date of Patent: Apr. 25, 2000

[54] DIFFERENTIAL AMPLIFIER CONSTITUTED OF BIPOLAR TRANSISTORS

[75] Inventor: Michinori Sugawara, Tokyo, Japan

[73] Assignee: NEC Corporation, Tokyo, Japan

[21] Appl. No.: 09/170,717

[22] Filed: Oct. 14, 1998

[30] Foreign Application Priority Data

Oct. 14, 1997 [JP] Japan ..................................... 9-280715

[51] Int. Cl.[7] ................................. H03F 3/45; H03F 3/04
[52] U.S. Cl. ........................... 330/252; 330/261; 330/310
[58] Field of Search ..................................... 330/252, 261, 330/310, 311

[56] References Cited

U.S. PATENT DOCUMENTS

| | | | |
|---|---|---|---|
| 4,496,860 | 1/1985 | Tokumo ................................... | 330/252 |
| 4,855,684 | 8/1989 | Gerstenhaber et al. ................. | 330/261 |
| 5,101,126 | 3/1992 | Butler et al. ............................ | 330/252 |
| 5,399,988 | 3/1995 | Knierim .................................... | 330/311 |
| 5,532,644 | 7/1996 | Nakagawara ............................ | 330/252 |
| 5,742,248 | 4/1998 | Vorenkamp et al. .................... | 330/252 |

FOREIGN PATENT DOCUMENTS

| | | |
|---|---|---|
| 0603942A1 | 12/1993 | European Pat. Off. . |
| 0637128A1 | 7/1994 | European Pat. Off. . |
| 57-160207 | 10/1982 | Japan . |

OTHER PUBLICATIONS

T. Kumamoto et al., "A 1–bit 50MS/s 500m W A/D Converter with Differential–Voltage Subconverter", Technical Report of IEICE (in Japan), ED93–47, ICD93–96 (Jun. 1994), pp. 17–22.

*Primary Examiner*—Robert Pascal
*Assistant Examiner*—Patricia T. Nguyen
*Attorney, Agent, or Firm*—Sughrue, Mion, Zinn, Macpeak & Seas, PLLC

[57] ABSTRACT

In a differential amplifier comprising a non-linear distortion compensating circuit including a differential emitter follower, and a first group of current sources having a first differential pair of transistors having bases receiving a pair of emitter currents of the differential emitter follower, respectively, so that the first group of current sources are controlled by the pair of emitter currents of the differential emitter follower, and a differential buffer including a second differential pair of transistors having bases receiving signals outputted from the non-linear distortion compensating circuit, respectively, there is provided a base current compensating circuit for supplying to emitter nodes of the differential emitter follower, a current for reducing a non-linear distortion caused by base currents of the transistors of the second differential pair in the differential buffer and the transistors of the first differential pair in the first group of current sources.

6 Claims, 13 Drawing Sheets

DIFFERENTIAL AMPLIFIER CONSTITUTED OF BIPOLAR TRANSISTORS

BACKGROUND OF THE INVENTION

1. Field of the Invention

The present invention relates to a differential amplifier, and more specifically to a differential amplifier constituted of bipolar transistors.

2. Description of Related Art

Referring to FIG. 8, there is shown a circuit diagram illustrating one example of a prior art differential amplifier constituted of bipolar transistors. In brief, the shown differential amplifier includes a pair of NPN bipolar transistors Q1 and Q2 having bases connected to a pair of input terminals IN1 and IN2, respectively, between which a differential input voltage VIN is applied Collectors of the transistors Q1 and Q2 are connected to a power supply voltage VCC through load resistors R1 and R2, respectively. In addition, the collectors of the transistors Q1 and Q2 are connected to a pair of output terminals OUT1 and OUT2, respectively, from which a differential output voltage VOUT is obtained. Emitters of the transistors Q1 and Q2 are connected to ground through current sources I1 and I2 having a constant current I0, respectively. The emitters of the transistors Q1 and Q2 are connected to each other through an emitter feedback resistor R3.

The differential amplifier as shown in FIG. 8, constituted of bipolar transistors and including the emitter feedback resistor, is used as a differential amplifier having a relatively wide input voltage range which can be approximately deemed to operate linearly. In addition, the shown differential amplifier also has another advantage that a gain precision can be easily obtained since a nominal gain is given by a ratio between the emitter feedback resistor and the load resistors.

However, when the differential amplifier as shown in FIG. 8 is used as an input buffer in an analog-to-digital converter, since a high linearity is required, it is an ordinary practice to make improvement in order to elevate the linearity.

Now, assuming R1=R2=1000Ω, R3=2000Ω and I0=0.25 mA in the differential amplifier as shown in FIG. 8, the result of a "SPICE" (Simulation Program with Integrated Circuit Emphasis) simulation will be described in the following:

FIG. 9 is a graph illustrating a relation between a differential input voltage VIN and a non-linear error VD in the differential amplifier as shown in FIG. 8. Here, VD is a difference between a differential output voltage VOUT= VOUT (VIN) and a tangential line VL=VL (VIN) in differential output voltage VOUT (VIN) at the time of VIN=0V.

$$VD = VOUT(VIN) - VL(VIN)$$

Accordingly, VD is indicative of the non-linearity in the differential output voltage VOUT. In the following, for purposes of convenience, this VD will be called a non-linear error.

If the differential output voltage VOUT has a complete linearity in relation to the differential input voltage VIN, the non-linear error VD ceaselessly becomes zero.

For purposes of convenience, assume that if the non-linear error VD is within the range of ±1 mV, it can be deemed to be linear. In this case shown in FIG. 9, the range of the differential input voltage VIN permitting the linear operation becomes ±220 mV. On the other hand, since the differential output voltage VOUT of the shown differential amplifier is cramped at ±500 mV, and since the nominal gain is 1 (=2×R1/R3), a maximum operable range of the differential input voltage VIN is also ±500 mV. However, the shown differential amplifier can operate in a linear operating mode in only a range which is a half of the maximum operable range In addition, the gain at the differential input voltage VIN=0V, namely, the inclination of the tangential line VL, is 0.86, which is smaller than the nominal gain 1 at some degree.

The non-linear operation of the differential amplifier shown in FIG. 8 is mainly attributable to the circumstances that a base-emitter voltage (VBE) of the bipolar transistors Q1 and Q2 non-linearly changes in relation to a collector current (IC).

Now, one prior art example for improving the linearity will be described with reference to FIG. 10, which is a circuit diagram illustrating another prior art example of the differential amplifier, which is constituted to improve the linearity of the differential amplifier shown in FIG. 8 and which is shown in FIG. 7(a) of T. Kumamoto et at, "A 10-bit 50 MS/s 50 mW A/D Converter with Differential-Voltage Subconverter", Technical Report of IEICE (The Institute of Electronics, Information and Communication Engineers (in Japan)), ED93-47, ICD9346 (1994-06), pp17–22. In FIG. 10, elements corresponding to those shown in FIG. 8 are given the same Reference Numerals, and explanation will be omitted.

In the differential amplifier shown in FIG. 10, diodes D1 and D2 are inserted between the power supply voltage VCC and the load resistors R1 and R2, respectively. In this example, the non-linearity is compensated by the diodes D1 and D2, so that a linear differential output voltage is obtained.

Actually, assuming R1=R2=R3/2, the differential output voltage VOUT is expressed as follows:

$$V_{OUT} = (2 \times R_1 / R_3) \times (V_{IN} - V_{BE1} + V_{BE2}) + V_{D1} - V_{D2}$$
$$= V_{IN} - V_{BE1} + V_{BE2} + V_{D1} - V_{D2}$$
$$= V_{IN}$$

where VBE1, VBE2, VD1 and VD2 are a base-emitter voltage of the bipolar transistors Q1 and Q2, and a forward-direction voltage drop of the diodes D1 and D2, respectively. In addition, VBE1 is substantially equal to VD1 (since a current flowing through Q1 is substantially equal to a current flowing through D1), and also VBE2 is substantially equal to VD2. Thus, the result expressed by the above equation is obtained Now, assuming R1=R2=1000Ω, R3=2000Ω and I0=0.25 mA in the differential amplifier as shown in FIG. 10, the result of the SPICE simulation will be described in the following:

FIG. 11 is a graph illustrating a relation between a differential input voltage VIN and a non-linear error VD in the differential amplifier as shown in FIG. 10. As seen from comparison between FIG. 9 and FIG. 11, the differential amplifier shown in FIG. 10 has a linearly operating range wider than that of the differential amplifier shown in FIG. 8. Namely, the differential amplifier shown in FIG. 10 has an improved linearity.

In addition, the gain at the differential input voltage VIN=0V, namely, the inclination of the tangential line VL, is 0.9808, which is slightly less than the nominal gain 1 but is nearer to 1, in comparison with the differential amplifier shown in FIG. 8.

However, since the differential amplifier shown in FIG. 10 includes the diode connected in series with the load resistor, a common-mode output potential drops by the forward-direction voltage drop (about 0.8V) of the diode, and therefore, when the power supply voltage is low, a next-stage circuit directly receiving the output of the differential amplifier becomes difficult to properly operate at a low power supply voltage.

Referring to FIG. 12, there is shown a circuit diagram illustrating still another prior art example of the differential amplifier, which is shown in Japanese Patent Application Pre-examination Publication No. JP-A-57-160207, which corresponds to U.S. Pat. No. 4,496,860, the content of which is incorporated by reference in its entirety into this application. In FIG. 12, elements corresponding to those shown in FIG. 8 are given the same Reference Numerals, and explanation will be omitted The differential amplifier shown in FIG. 12 includes a non-linear distortion compensating circuit 101 provided as an input stage receiving a differential input voltage, and a differential buffer 102 constructed completely similarly to the differential amplifier shown in FIG. 8. The non-linear distortion compensating circuit 101 includes a pair of NPN bipolar transistors Q3 and Q4 having collectors connected directly to a power supply voltage VCC. Bases of the transistors Q3 and Q4 are connected to a pair of input terminals IN1 and IN2, respectively, between which a differential input voltage VIN is applied. Emitters of the transistors Q3 and Q4 are connected to the bases of the transistors Q1 and Q2, respectively.

The non-linear distortion compensating circuit 101 also includes another pair of NPN bipolar transistors Q5 and Q6 each having a base cross-connected to a collector of the other of the pair of NPN bipolar transistors Q5 and Q6. The collectors of the NPN bipolar transistors Q5 and Q6 are connected to the emitters of the transistors Q3 and Q4, respectively. Emitters of the transistors Q5 and Q6 are connected to ground through current sources I3 and I4, respectively. The emitters of the transistors Q5 and Q6 are connected to each other through an emitter feedback resistor R4.

In the differential amplifier shown in FIG. 12, a current of an emitter follower (the bipolar transistors Q3 and Q4) in the non-linear distortion compensating circuit 101 changes dependently upon the input differential voltage VIN (input signal), and a base-emitter voltage VBE of the bipolar transistors Q3 and Q4 changes dependently upon the change of the current of the emitter follower, with the result that the change of the base-emitter voltage VBE of the bipolar transistors Q1 and Q2 in the differential buffer 102 is canceled, so that a linear differential output voltage can be obtained.

Actually, assuming R1=R2=R3/2=R4/2, the differential output voltage VOUT of the differential amplifier shown in FIG. 12 is expressed as follows:

$$V_{OUT} = (2 \times R_1 / R_3) \times (V_{IN} - V_{BE3} - V_{BE1} + V_{BE4} + V_{BE2})$$
$$= V_{IN} - V_{BE3} - V_{BE1} + V_{BE4} + V_{BE2}$$
$$= V_{IN}$$

where VBE1, VBE2, VBE3 and VBE4 are a base-emitter voltage of the bipolar transistors Q1, Q2, Q3 and Q4, respectively. In addition, VBE1 is substantially equal to VBE4 (since a current flowing through Q1 is substantially equal to a current flowing through Q4), and also VBE2 is substantially equal to VBE3. Thus, the result expressed by the above equation is obtained Differently from the differential amplifier shown in FIG. 10, since the differential amplifier shown in FIG. 12 has no drop in the common-mode output voltage, a next-stage circuit directly receiving the output of the differential amplifier becomes can properly operate at a low power supply voltage. In addition, the nominal gain is not necessarily required to be 1.

For reference, the gain at the differential input voltage VIN=0V, namely, the inclination of the tangential line VL, is 0.9718, which is slightly less than the nominal gain 1.

Actually, however, because of a base current of the bipolar transistors Q1, Q2, Q3 and Q4 which was ignored in the above mentioned equation, improvement of the linearity is not so good, and therefore, it has a disadvantage that the linearly operating range is narrow.

Now, assuming R1=R2=1000Ω, R3=2000Ω and I0=0.25 mA in the differential amplifier as shown in FIG. 12, the result of the SPICE simulation will be described in the following:

FIG. 13 is a graph illustrating a relation between a differential input voltage VIN and a non-linear error VD in the differential amplifier as shown in FIG. 12. As shown in FIG. 13, the linearly operating range is about ±300 mV, which cannot be said to be sufficiently wide.

Next, influence of the base current will be described.

VBE1 and VBE4 in this prior art differential amplifier shown in FIG. 12 are given by the following equations:

$$V_{BE1} = V_T \times \ln(I_{C1} / I_S)$$

$$V_{BE4} = V_T \times \ln[\{\beta/(\beta+1)\} \times (I_{C6} + I_{B2} + I_{B5})/I_S]$$
$$= V_T \times \ln[\{\beta/(\beta+1)\} \times \{I_{C1} + (2/\beta) \times I_{C2}\}/I_S]$$

where $V_T$ is a thermal voltage ($V_T$=kT/q; k=Boltzmann constant, T=absolute temperature, q=elementary charge), IS is a saturation current, IC1 to IC6 and IB1 to IB6 are a collector current and a base current of the transistors Q1 to Q6, and $\beta$ is a current gain. In addition, since the differential amplifier shown in FIG. 12 has a current mirror structure, a relation of IC6=IC1 and IB2=IB5 holds. By using this relation, the equation was modified.

The currents IC1 to IC6 change upon the change of the differential input voltage VIN, but if the change of VBE1 is equal to the change of VB4, the linear operation of the circuit is obtained Actually, however, since the base currents exist, it would be understood from the above equation that the change of VBE1 never becomes equal to the change of VBE4.

SUMMARY OF THE INVENTION

Accordingly, it is an object of the present invention to provide a differential amplifier which has overcome the above mentioned defects of the conventional ones, Another object of the present invention is to provide a differential amplifier having a widened linearly operating range and having a high common-phase output potential to permit a next-stage circuit to operate at a low power supply voltage.

The above and other objects of the present invention are achieved in accordance with the present invention by a differential amplifier comprising:

a non-linear distortion compensating circuit including a differential emitter follower, and a first group of current sources having a first differential pair of transistors having bases receiving a pair of emitter currents of the differential emitter follower, respectively, so that the first group of current sources are controlled by the pair of emitter currents of the differential emitter follower, a differential buffer including a second differential pair of transistors having bases receiving signals outputted from the non-linear distortion compensating circuit, respectively, and a base current compensating circuit for supplying at least a portion of each of base currents of the transistors of the second differential pair in the differential buffer and the transistors of the first differential pair in the first group of current sources.

According to another aspect of the present invention, there is provided a differential amplifier comprising:

a non-linear distortion compensating circuit including a differential emitter follower, and a first group of current sources having a first differential pair of transistors having bases receiving a pair of emitter currents of the differential emitter follower, respectively, so that the first group of current sources are controlled by the pair of emitter currents of the differential emitter follower;

a differential buffer including a second differential pair of transistors having bases receiving signals outputted from the non-linear distortion compensating circuit, respectively, and a base current compensating circuit for supplying to emitter nodes of the differential emitter follower, a current for reducing a non-linear distortion caused by base currents of the transistors of the second differential pair in the differential buffer and the transistors of the first differential pair in the first group of current sources.

In one embodiment of the differential amplifier, the base current compensating circuit is internally provided in the non-linear distortion compensating circuit.

The non-linear distortion compensating circuit includes a second group of current sources controlled to be ceaselessly equal to the base currents of the transistors of the second differential pair in the differential buffer.

In addition, the base current compensating circuit includes a current mirror circuit for supplying a predetermined base current to the transistors of the second differential pair in the differential buffer. Preferably, the current mirror circuit has a magnifying power predetermined for eliminating a non-linear distortion caused by the base current.

Furthermore, the base current compensating circuit supplies a constant current for eliminating a non-linear distortion caused by the base currents of the transistors of the second differential pair in the differential buffer and the transistors of the first differential pair in the first group of current sources.

Alternatively, the base current compensating circuit includes a pair of resistors provided to comply with the differential emitter follower in the non-linear distortion compensating circuit.

As mentioned above, the differential amplifier in accordance with the present invention includes the base current compensating circuit for supplying at least a portion of each of base currents of the transistors of the second differential pair in the differential buffer and the transistors of the first differential pair in the first group of current sources. With this arrangement, a current for reducing a non-linear distortion caused by base currents of the transistors of the second differential pair in the differential buffer and the transistors of the first differential pair in the first group of current sources, is supplied from the base current compensating circuit to the transistors of the second differential pair in the differential buffer and the transistors of the first differential pair in the first group of current sources, as a base current.

Thus, the differential amplifier operates linearly, and a widened linearly operating range and a high common-mode output potential are simultaneously realized.

The above and other objects, features and advantages of the present invention will be apparent from the following description of preferred embodiments of the invention with reference to the accompanying drawings.

DESCRIPTION OF THE PREFERRED EMBODIMENTS

Now, embodiments of the differential amplifier in accordance with the present invention will be described with reference to the accompanying drawings.

Figure 1:
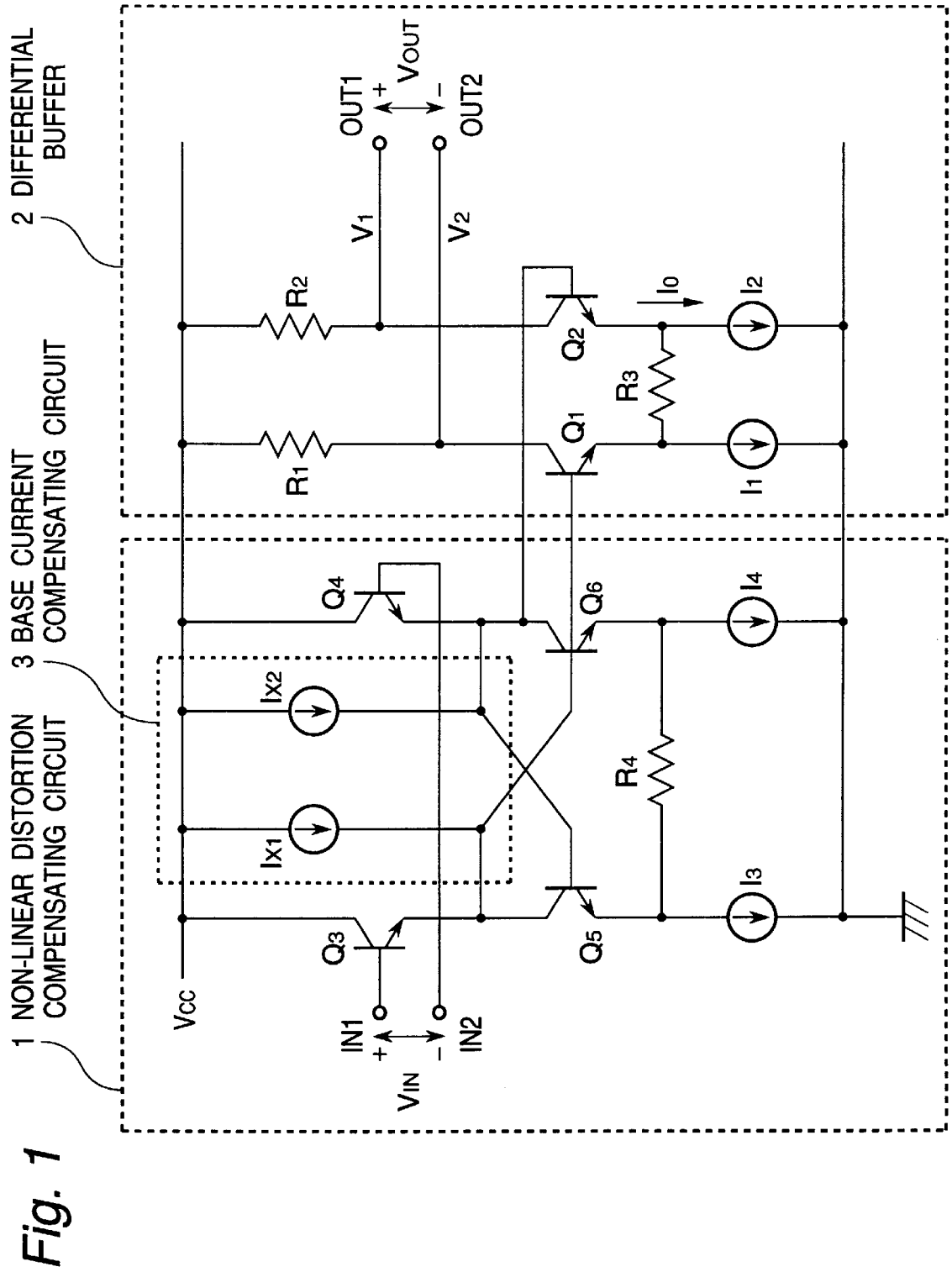
FIG. 1 is a circuit diagram illustrating a basic construction of the differential amplifier in accordance with the present invention.
Figure 12:
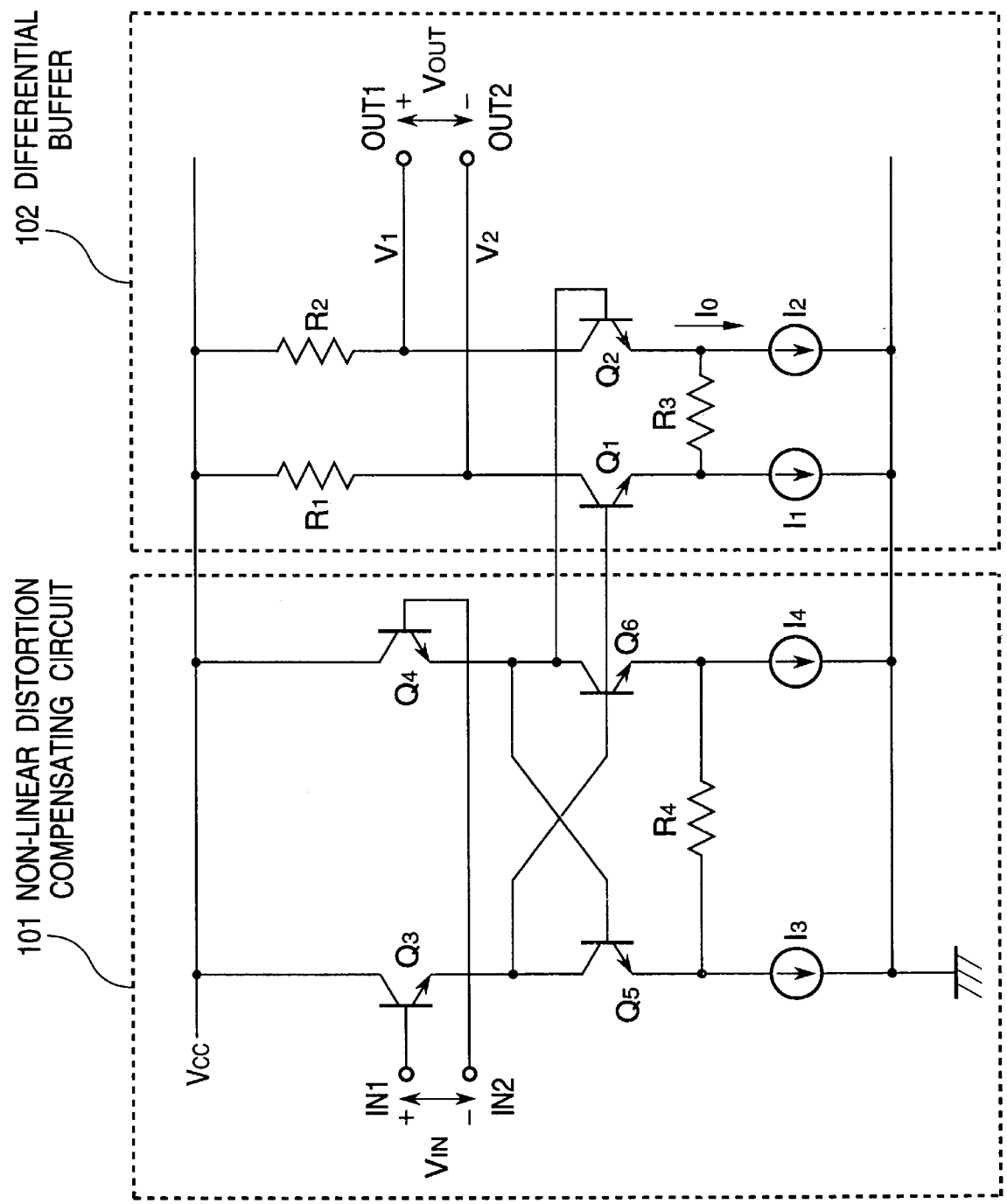
FIG. 12 is a circuit diagram illustrating still another example of the prior art differential amplifier constituted of bipolar transistors.
Figure 13:
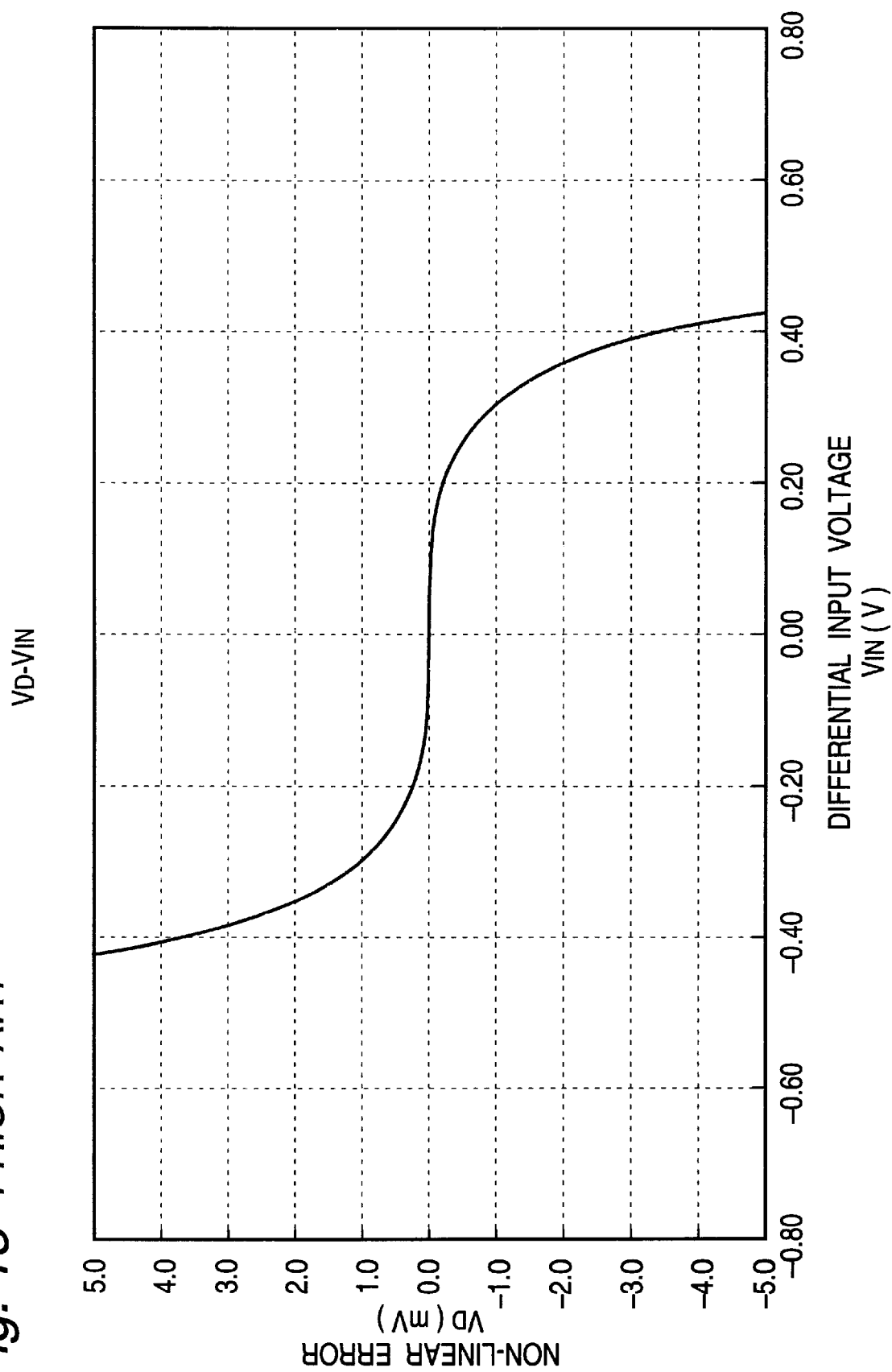
FIG. 13 is a graph illustrating a relation between a differential input voltage VIN and a non-linear error VD in the differential amplifier shown in FIG. 12, based on the SPICE simulation.

Referring to FIG. 1, there is shown a circuit diagram illustrating a basic construction of the differential amplifier in accordance with the present invention. In FIG. 1, elements corresponding to those shown in FIG. 12 are given the same Reference Numerals.

The differential amplifier shown in FIG. 1 includes a non-linear distortion compensating circuit 1 including a differential emitter follower and a first group of current sources having a first differential pair of transistors having bases receiving a pair of emitter currents of the differential emitter follower, respectively, so that the first group of current sources are controlled by the pair of emitter currents of the differential emitter follower, and a differential buffer 2 including a second differential pair of transistors having bases receiving signals outputted from the non-linear distortion compensating circuit 1, respectively. Furthermore, the non-linear distortion compensating circuit 1 includes a base current compensating circuit 3 for supplying at least a portion of each of base currents of the transistors of the second differential pair in the differential buffer 2 and the transistors of the first differential pair in the first group of current sources.

More specifically, the non-linear distortion compensating circuit 1 includes a differential pair of NPN bipolar transistors Q3 and Q4 having collectors connected directly to a power supply voltage of a predetermined potential (VCC). Bases of the transistors Q3 and Q4 are connected to a pair of input terminals IN1 and IN2, respectively, between which a differential input voltage VIN is applied. The non-linear distortion compensating circuit 101 also includes an NPN bipolar transistor Q5 having a collector connected to an emitter of the transistor Q3 and a base connected to an emitter of the transistor Q4, and an NPN bipolar transistor Q6 having a collector connected to an emitter of the transistor Q4 and a base connected to an emitter of the transistor Q3, a resistor R4 connected between an emitter of the NPN bipolar transistor Q5 and an emitter of the NPN bipolar transistor Q6, a constant current source I3 connected between the emitter of the NPN bipolar transistor Q5 and the ground, a constant current source I4 connected between the emitter of the NPN bipolar transistor Q6 and the ground, a current source IX1 connected between the emitter of the NPN bipolar transistor Q3 and the power supply voltage VCC, and a current source IX2 connected between the emitter of the NPN bipolar transistor Q4 and the power supply voltage VCC. The differential emitter follower is constituted of the transistors Q3 and Q4. The first group of current sources are constituted of the transistors Q5 and Q6 and the constant current sources I3 and I4. The base current compensating circuit 3 is constituted of the current sources IX1 and IX2.

On the other hand, the differential buffer 2 includes a differential pair of NPN transistors. Q1 and Q2 having bases connected to receive emitter potentials of the transistors Q3 an Q4, respectively, a pair of resistors R1 and R2 connected between collectors of the NPN transistors Q1 and Q2 and the power supply voltage VCC, respectively, a resistor R3 connected between an emitter of the transistor Q1 and an emitter of the transistor Q2, a constant current source I1 connected between an emitter of the transistor Q1 and the ground, and a constant current source I2 connected between an emitter of the transistor Q2. Thus, the collectors of the transistors Q1 and Q2 are supplied through the resistors R1 and R2 with a predetermined potential (VCC).

Next, an operation of the differential amplifier constructed as mentioned above will be described.

In brief, a differential input voltage VIN applied between the bases of the transistors Q3 and Q4 is supplied between the bases of the transistors Q1 and Q2 while the potential difference is maintained as it is, and then, is multiplied by the nominal gain of $\{(R1+R2)/R3\}$ so that it is outputted between the collectors of the transistors Q1 and Q2 as the differential output voltage VOUT.

Next, a linearity of the differential output voltage VOUT to the differential input voltage VIN will be described.

As mentioned hereinbefore, since

VOUT={R1+R2)/R3}×(VIN−VBE3−VBE1+VBE4+VBE2)

the following equation holds as regards a change amount:

ΔVOUT=A×(ΔVIN−ΔVBE3−ΔVBE1+ΔVBE4+ΔVBE2)

where A=(R1+R2)/R3, and ΔVOUT, ΔVIN, ΔVBE3, ΔVBE1, ΔVBE4 and ΔVBE2 are a change amount of VOUT, VIN, VBE3, VBE1, VBE4 and VBE2, respectively.

Accordingly, in order to establish the linearity, it is sufficient if a relation of ΔVBE1=ΔVBE4 and ΔVBE2=ΔVBE3 holds.

Since $$\Delta V_{BE4} = V_T \times \ln\{I_{C1} + \Delta I_C + (2/\beta) \times (I_{C2} - \Delta I_C) - I_X - \Delta I_X\} - V_T \times \ln\{I_{C1} + (2/\beta) \times I_{C2} - I_X\}$$

and $$\Delta V_{BE1} = V_T \times \ln(I_{C1} + \Delta I_C) - V_T \times \ln I_{C1}$$

a linear operation is realized by giving IX a value which makes VBE4 equal to VBE1. Here, it is assumed that ΔIC=ΔIC1=ΔIC2. Since a similar relation holds in connection with ΔVBE2 and ΔVBE3, explanation will be omitted.

Embodiment 1

Figure 2:
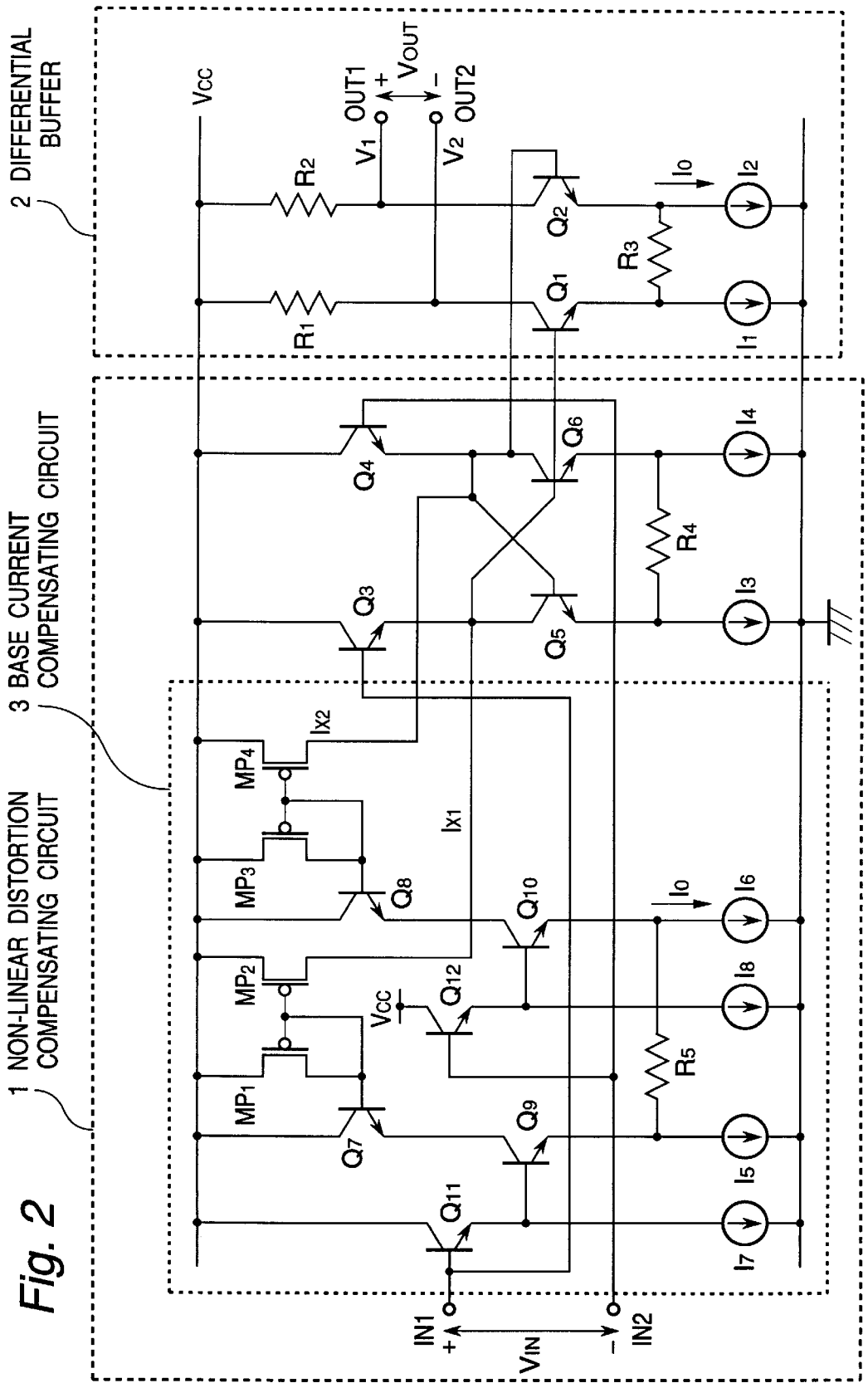
FIG. 2 is a circuit diagram of a first embodiment of the differential amplifier shown in FIG. 1.

Referring to FIG. 2, there is shown a circuit diagram of a first embodiment of the differential amplifier shown in FIG. 1. In FIG. 2, elements corresponding to those shown in FIG. 1 are given the same Reference Numerals, and explanation will be omitted for simplification of description.

In order to make the current sources IX1 and IX2 shown in FIG. 1 equal to a sum of base currents of the transistors Q1 and Q6 and a sum of base currents of the transistors Q2 and Q5, respectively, the base current compensating circuit 3 in this first embodiment includes, as shown in FIG. 2, PMOS transistors MP1 to MP4 controlled by base currents of transistors Q7 and Q8, a current control circuit composed of transistors Q9 and Q10 and a resistor R5 for supplying currents to the transistors Q7 and Q8, and emitter follower transistors Q11 and Q12 receiving the differential input voltage, for controlling the current control circuit composed of the transistors Q9 and Q10 and the resistor R5.

Specifically, the input terminal IN1 is connected to a base of the transistor Q11, and the input terminal IN2 is connected to a base of the transistor Q12. Collectors of the transistors Q11 and Q12 are connected to the power supply voltage VCC. An emitter of the transistor Q11 is connected to a base of the transistor Q9 and also connected to the ground through a constant current source I7. An emitter of the transistor Q12 is connected to a base of the transistor Q10 and also connected through a constant current source I8 to the ground.

A collector of the transistor Q9 is connected to an emitter of the transistor Q7, and an emitter of the transistor Q9 is connected through a constant current source I5 to the ground. A collector of the transistor Q10 is connected to an emitter of the transistor Q8, and an emitter of the transistor Q10 is connected through a constant current source I6 to the ground, and also connected through the resistor R5 to the emitter of the transistor Q9.

Collectors of the transistors Q7 and Q8 are connected to the power supply voltage VCC. A base of the transistor Q7 is connected to a drain and a gate of the PMOS transistor MP1 and a gate of the PMOS transistor MP2. Sources of the PMOS transistors MP1 and MP2 are connected to the power supply voltage VCC. A drain of the PMOS transistor MP2 is connected to the bases of the transistors Q1 and Q6. Therefore, the PMOS transistors MP1 and MP2 constitute a current mirror circuit.

A base of the transistor Q8 is connected to a drain and a gate of the PMOS transistor MP3 and a gate of the PMOS transistor MP4. Sources of the PMOS transistors MP3 and MP4 are connected to the power supply voltage VCC. A drain of the PMOS transistor MP4 is connected to the bases of the transistors Q2 and Q5. Therefore, the PMOS transistors MP3 and MP4 constitute a current mirror circuit.

Here, all the constant current sources I1 to I8 have the same current value I0. For example, I0=0.25 mA, R1=R2=1 k$\Omega$, and R3=R4=R5=2 k$\Omega$.

Now, an operation of the differential amplifier constructed as mentioned above will be described.

Since the base current of the transistor Q8 is substantially equal to the base current of the transistor Q2, if the current mirror circuit formed of the PMOS transistors MP3 and MP4 is so designed that a current equal to a double of the current flowing through the PMOS transistor MP3, flows through the PMOS transistor MP4 (magnifying power of 2), the PMOS transistor MP4 can supply the base currents of the transistors Q2 and Q5, so that the current flowing through the transistor Q4 is no longer required to supply the base currents of the transistors Q2 and Q5.

Accordingly, $\Delta V_{BE4}$ is expressed by the following equation:

$$\Delta V_{BE4} = V_T \times \ln\{I_{C1} + \Delta I_C + (2/\beta) \times (I_{C2} - \Delta I_C) - I_X - \Delta I_X\} -$$
$$V_T \times \ln\{I_{C1} + (2/\beta) \times I_{C2} - I_X\}$$
$$= V_T \times \ln(I_{C1} + \Delta I_C) - V_T \times \ln I_{C1}$$
$$= \Delta V_{BE1}$$

Similarly, it becomes $\Delta VBE3 = \Delta VBE2$. Thus, a linear operation is realized.

Figure 3:
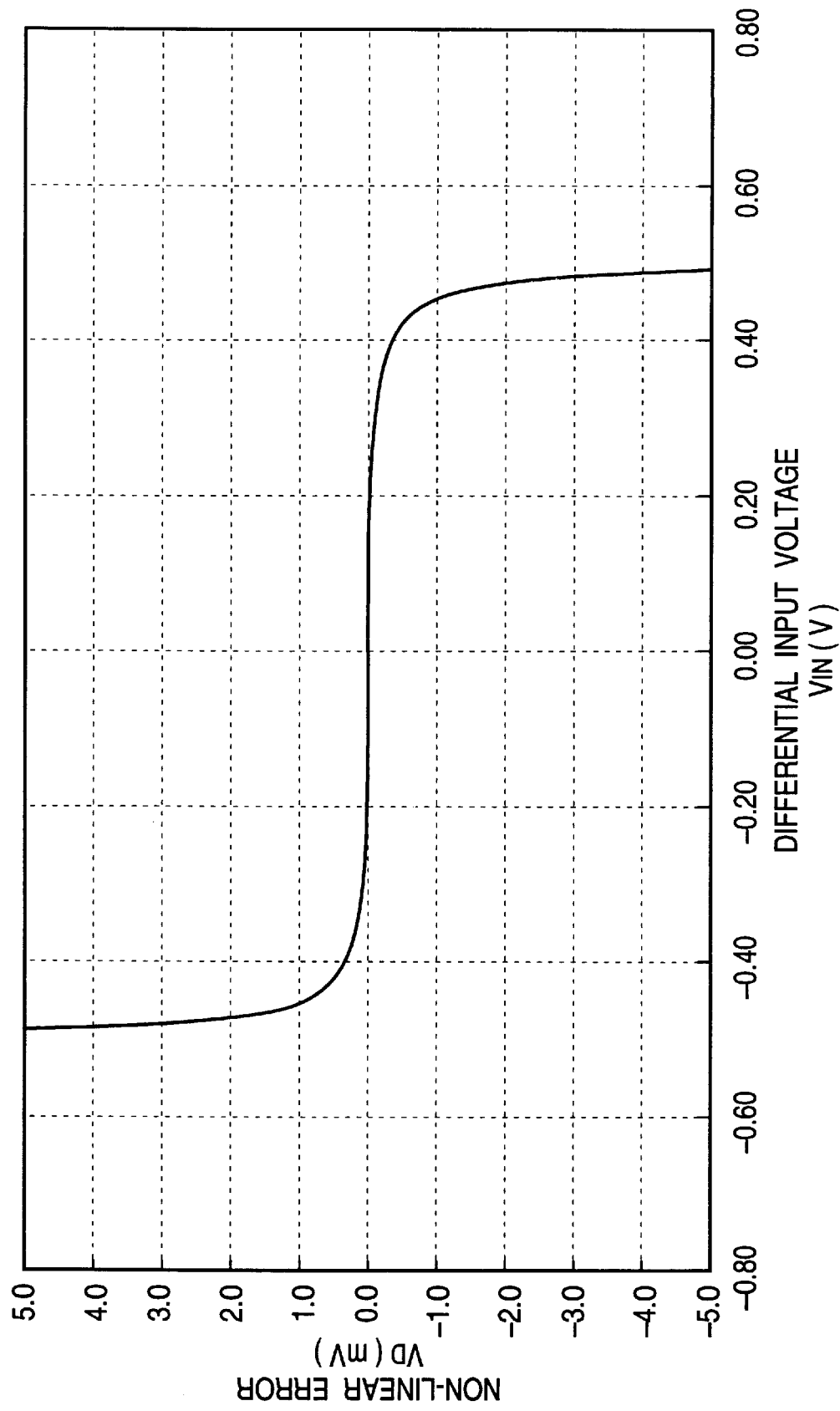
FIG. 3 is a graph illustrating a relation between a differential input voltage VIN and a non-linear error VD in the differential amplifier shown in FIG. 2, based on the SPICE simulation.

Referring to FIG. 3, there is shown a graph illustrating a relation between a differential input voltage VIN and a non-linear error VD in the differential amplifier shown in FIG. 2, based on the SPICE simulation.

As shown in FIG. 3, the linearly operating range was extended to ±450 mV. In addition, the gain was 0.9789, which is larger than that obtained in the prior art differential amplifier shown in FIG. 12.

Incidentally, if the current value of the constant current sources I5 and I6 is halved (to I0/2), and furthermore, if the PMOS transistor current mirror circuits are so designed that the output current is four times the input current (magnifying power of 4), a similar effect can be obtained.

In addition, if the current value of the constant current sources I3 and I4 are made to I0/k, and also if the resistance of the resistor R4 is made to k times, and if the magnifying power of the PMOS transistor current mirror circuits is suitably set so as to supply necessary base currents, a similar effect can be obtained. Furthermore, the current value of the constant current sources I7 and I8 can be changed from I0. In this case, it is sufficient if the size ratio of the bipolar transistors is suitably changed if necessary.

Moreover, it would be apparent that the transistors Q11 and Q12 of the emitter follower can be constructed similarly to the non-linear distortion compensating circuit shown in FIG. 12, so as to realize the matching of the base currents.

Since modifications in the size of the constituents and in the ratio of the currents are a matter of design to persons skilled in the art, a further explanation will be omitted.

In the above mentioned equation, the output resistance of the current sources IX1 and IX2 was deemed to be infinite. However, in this embodiment, the current sources IX1 and IX2 have a non-negligible finite output resistance. When the current gain B is actually not the constant but varies upon the current value and the collector-emitter voltage, it is in some cases that a more excellent linearity can be obtained when the current sources IX1 and IX2 have a finite output resistance, than when the current sources IX1 and IX2 have an infinite output resistance. However, if it is desired to cause the current sources IX1 and IX2 to have a large output resistance enough to be deemed to be infinite, it is possible to use a well-known manner in which a drain of each of the PMOS transistors MP2 and MP4 is cascade-connected with a PMOS transistor having a gate suitably biased, so that the output resistance of the current sources IX1 and IX2 is enlarged. This is true in embodiments which will be described hereinafter.

Embodiment 2

Figure 4:
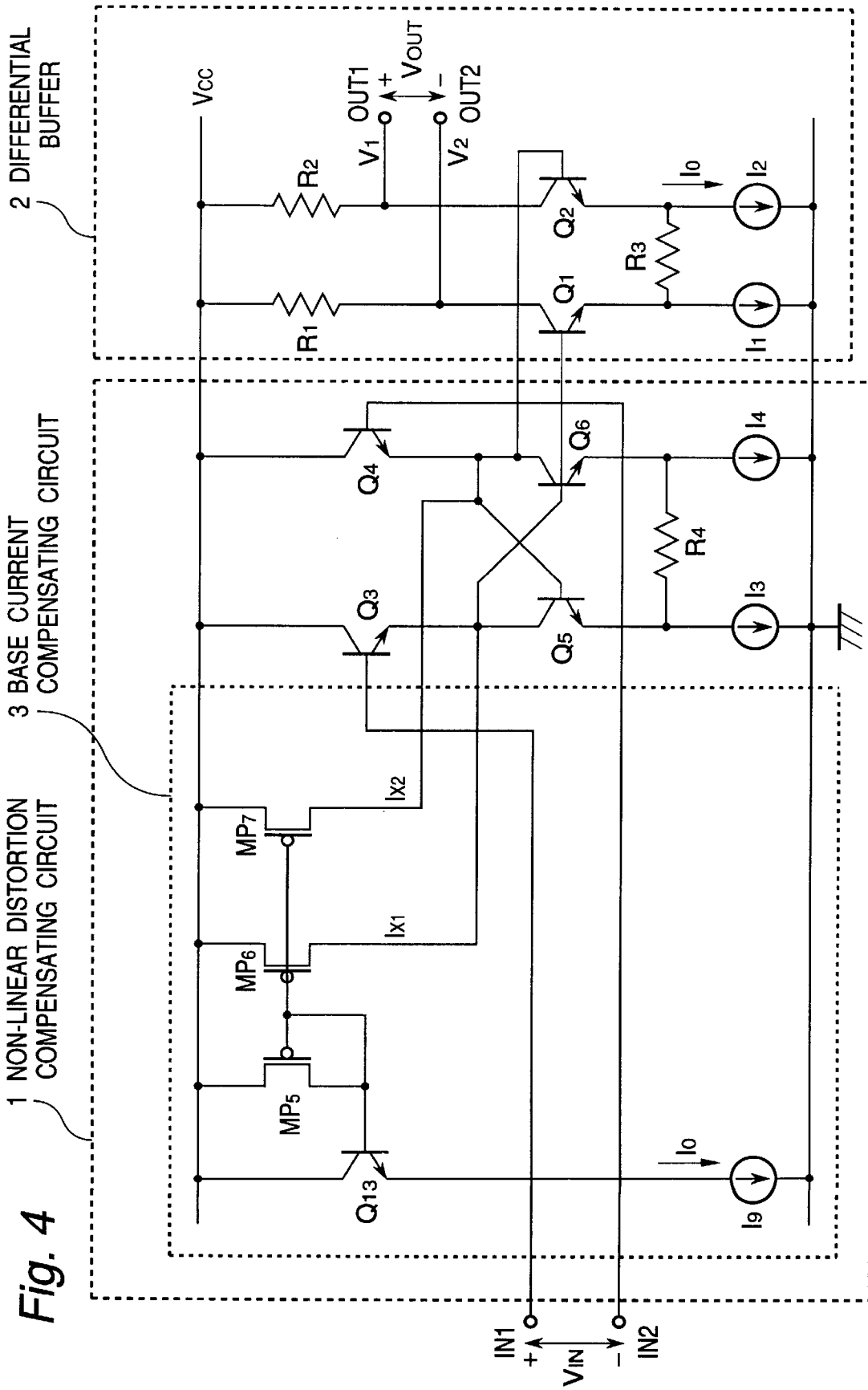
FIG. 4 is a circuit diagram of a second embodiment of the differential amplifier shown in FIG. 1.

Referring to FIG. 4, there is shown a circuit diagram of a second embodiment of the differential amplifier shown in FIG. 1. In FIG. 4, elements corresponding to those shown in FIG. 1 are given the same Reference Numerals, and explanation will be omitted for simplification of description.

The base current compensating circuit 3 in this second embodiment, namely, the current sources IX1 and IX2 shown in FIG. 1, include an NPN transistor Q13 having a collector connected to the power supply voltage VCC and an emitter connected through a constant current source I9 to the ground, and a current mirror circuit composed of three PMOS transistors MP5 to MP7 having sources connected to the power supply voltage VCC. A base of the NPN transistor Q13 is connected to a gate and a drain of the PMOS transistor MP5 and a gate of each of the PMOS transistors MP6 and MP7. A drain of the PMOS transistor MP6 is connected to the bases of the transistors Q1 and Q6, and a drain of the PMOS transistor MP7 is connected to the bases of the transistors Q2 and Q5.

Since a base current of the transistor Q13 is substantially equal to the base current of the transistor Q2 when the different input voltage VIN is 0 (zero), if the current mirror circuit of the PMOS transistors MP5 to MP7 is designed to have the magnifying power of 4 so that the current flowing through each of PMOS transistors MP6 and MP7 is equal to a double of the current flowing through PMOS transistor MP5, it is possible to supply a constant amount portion of the base currents of the transistors Q2 and Q5 and a constant amount portion of the base currents of the transistors Q1 and Q6 from the base current compensating circuit 3 of the second embodiment. Accordingly, $\Delta V_{BE4}$ is expressed by the following equation:

$$\Delta V_{BE4} = V_T \times \ln\{I_{C1\_0} + \Delta I_C + (2/\beta) \times (I_{C2\_0} - \Delta I_C) - I_X - \Delta I_X\} -$$
$$V_T \times \ln\{I_{C1\_0} + (2/\beta) \times I_{C2\_0} - I_X\}$$
$$= V_T \times \ln\{I_{C1\_0} + \Delta I_C + (2/\beta) \times (I_{C2\_0} - \Delta I_C)\} -$$
$$V_T \times \ln\{I_{C1\_0} + (2/\beta) \times I_{C2\_0}\}$$
$$= V_T \times \ln(I_{C1\_0} + \Delta I_C) - V_T \times \ln I_{C1\_0}$$
$$= \Delta V_{BE1}$$

where $IC1\_0$ is IC1 when VIN is zero and $IC2\_0$ is IC2 when VIN is zero, and it is deemed to be $\Delta IX=0$ under assumption that $IX=(4/\beta) \times IC1\_0$, $IC2\_0=IC1\_0$, and the output resistance is infinite.

Similarly, it becomes $\Delta VBE3 = \Delta VBE2$. Thus, a linear operation is realized.

Figure 5:
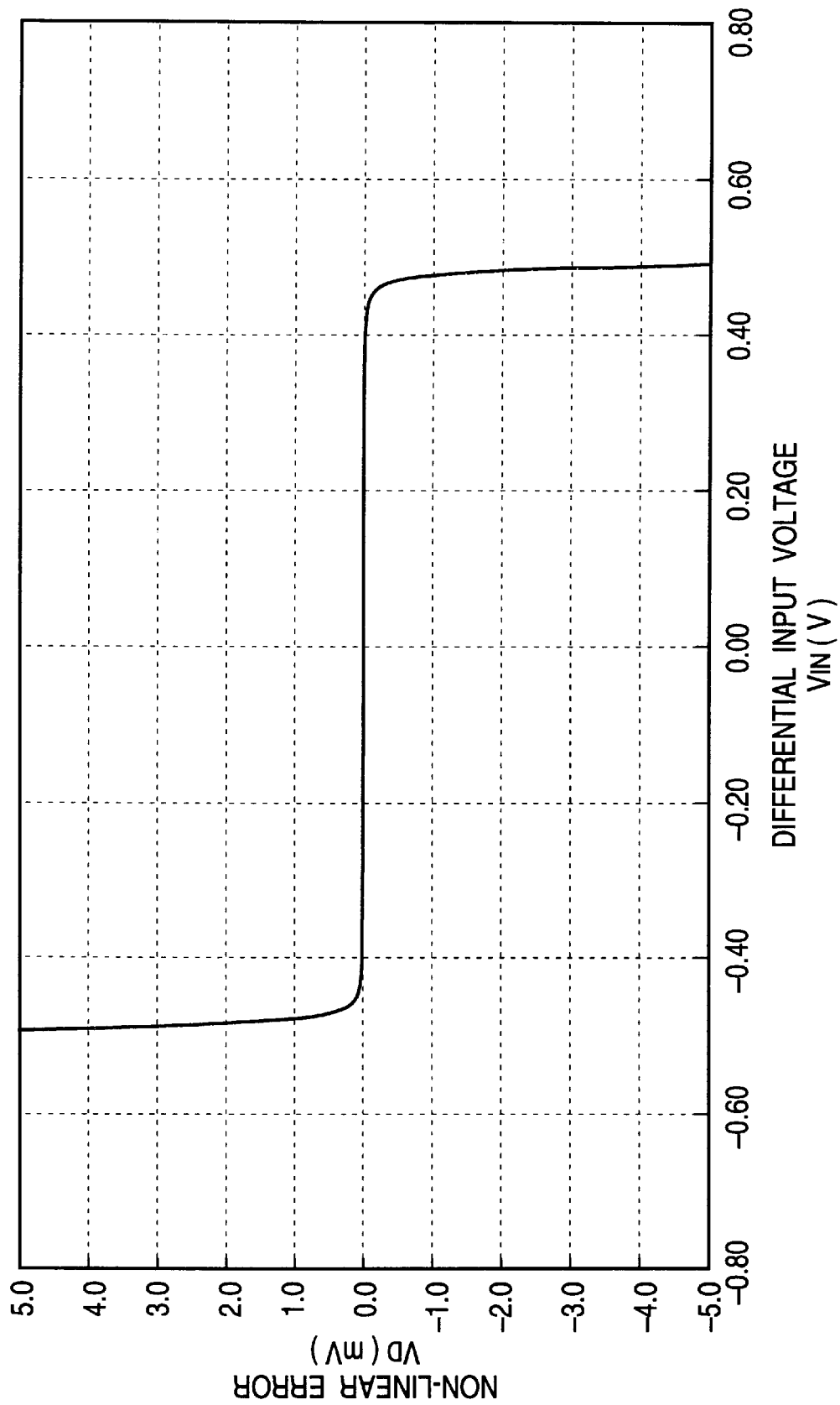
FIG. 5 is a graph illustrating a relation between a differential input voltage VIN and a non-linear error VD in the differential amplifier shown in FIG. 4, based on the SPICE simulation.

Referring to FIG. 5, there is shown a graph illustrating a relation between a differential input voltage VIN and a non-linear error VD in the differential amplifier shown in FIG. 4, based on the SPICE simulation.

As shown in FIG. 5, the linearly operating range was extended to ±480 mV. In addition, the gain was 0.9783, which is larger than that obtained in the prior art differential amplifier shown in FIG. 12.

In this second embodiment, the number of the constant current sources required to construct the current sources IX1 and IX2 is reduced to one from four required in the first embodiment. Therefore, the second embodiment can realize a low power consumption in comparison with the first embodiment Embodiment 3

Figure 6:
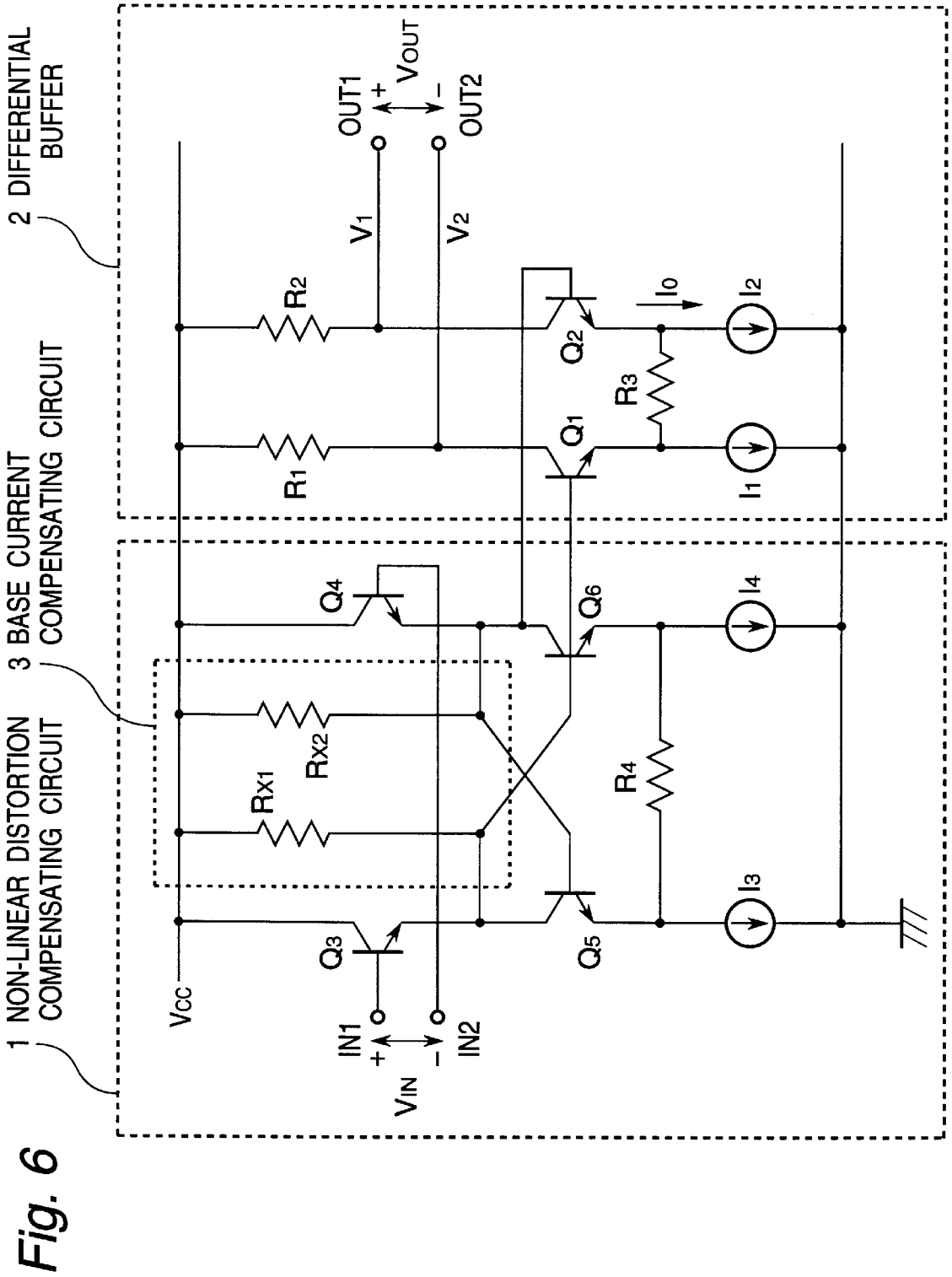
FIG. 6 is a circuit diagram of a third embodiment of the differential amplifier shown in FIG. 1.

Referring to FIG. 6, there is shown a circuit diagram of a third embodiment of the differential amplifier shown in FIG. 1. In FIG. 6, elements corresponding to those shown in FIG. 1 are given the same Reference Numerals, and explanation will be omitted for simplification of description.

The current sources IX1 and IX2 of the base current compensating circuit 3 in this third embodiment are constituted of only resistors RX1 and RX2, respectively. Accordingly, since the base current compensating circuit 3 in the third embodiment has no constant current source, the third embodiment can realize a low power consumption in comparison with the first and second embodiments.

Now, an operation of the third embodiment will be described.

Each of the resistors RX1 and RX2 can be deemed to be a current source which supplies a current IX_0 when the differential input voltage VIN is 0 (zero) and which has an output resistance RX. Here, RX is a resistance of the resistors RX1 and RX2.

Therefore, in the above mentioned equation giving ΔVBE4, if the situation when the differential input voltage VIN is 0 (zero) is considered to be as a reference condition, ΔIX is approximately expressed as follows:

$$\Delta IX = VIN/(2 \times RX)$$

In addition, since the differential input voltage VIN is approximately equal to R3×ΔIC, it becomes $$\Delta IX - (R3 \times \Delta IC)/(2 \times RX)$$

Accordingly, if the resistance value RX is determined to fulfill the following relation:

$$IX\_0 = \{4/\beta + R3(2 \times RX)\} \times IC1\_0$$

it becomes ΔVBE4=ΔVBE1.

Figure 7:
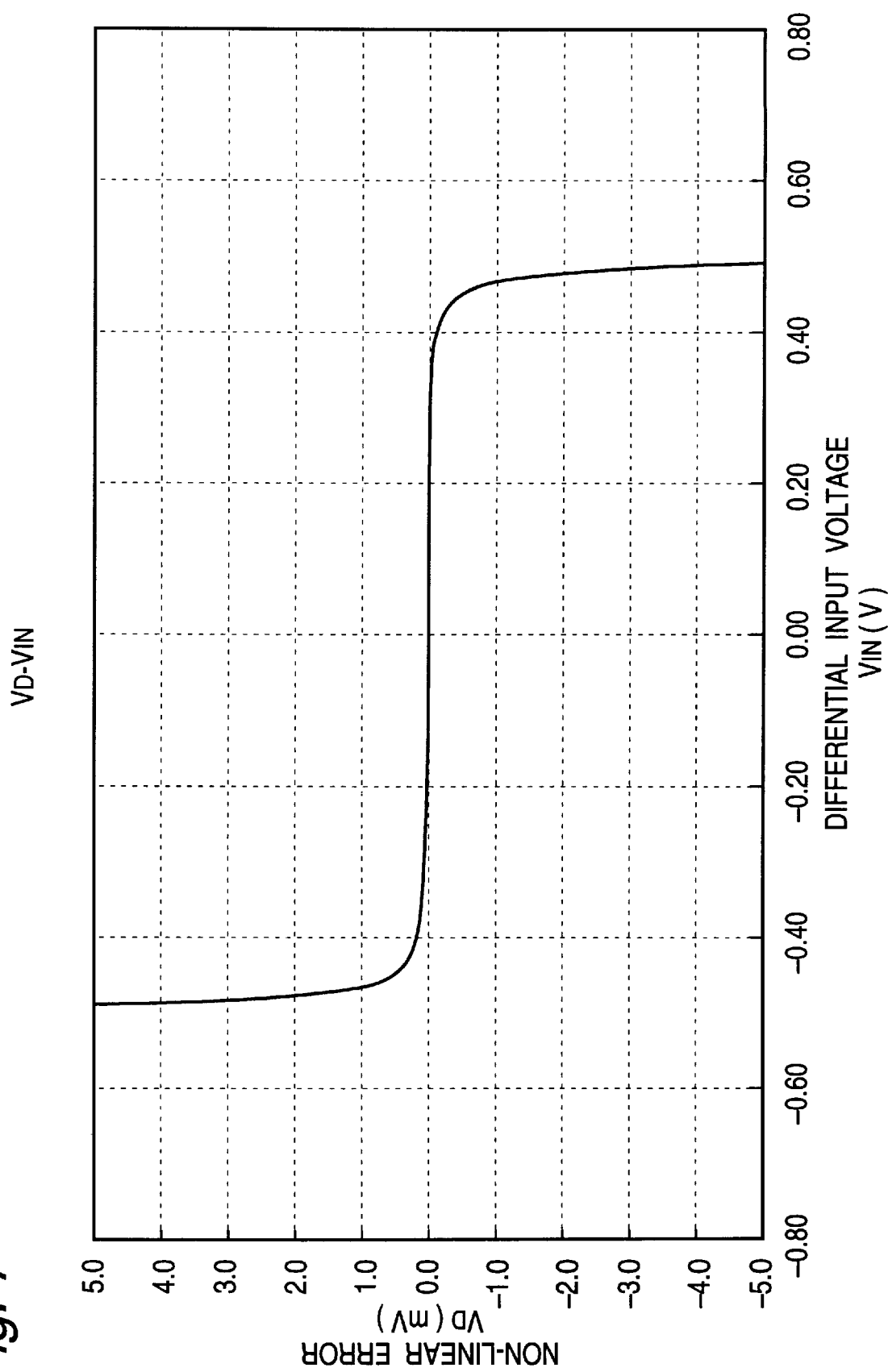
FIG. 7 is a graph illustrating a relation between a differential input voltage VIN and a non-linear error VD in the differential amplifier shown in FIG. 6, based on the SPICE simulation.
Figure 8:
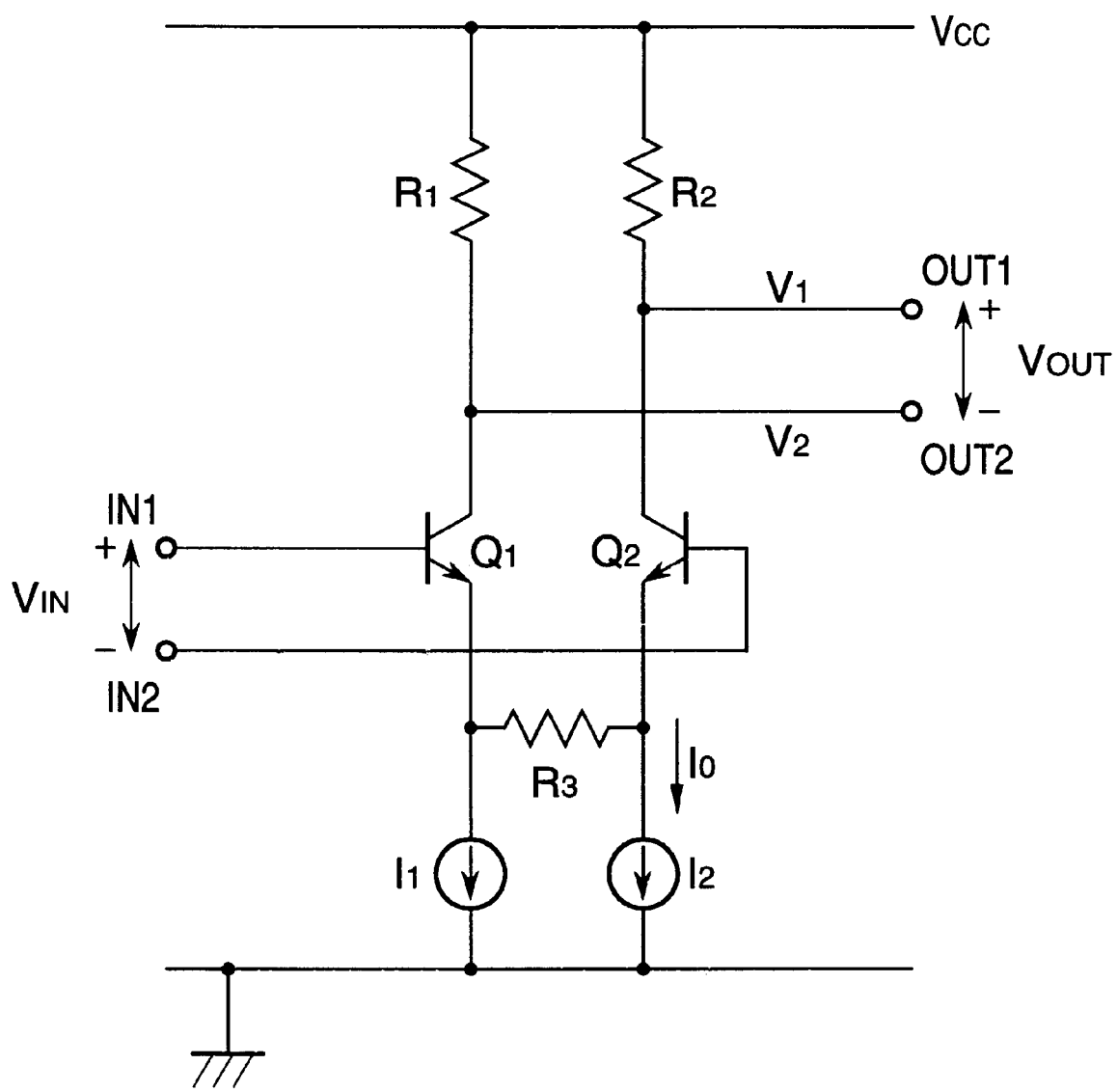
FIG. 8 is a circuit diagram illustrating one example of the prior art differential amplifier constituted of bipolar transistors.
Figure 9:
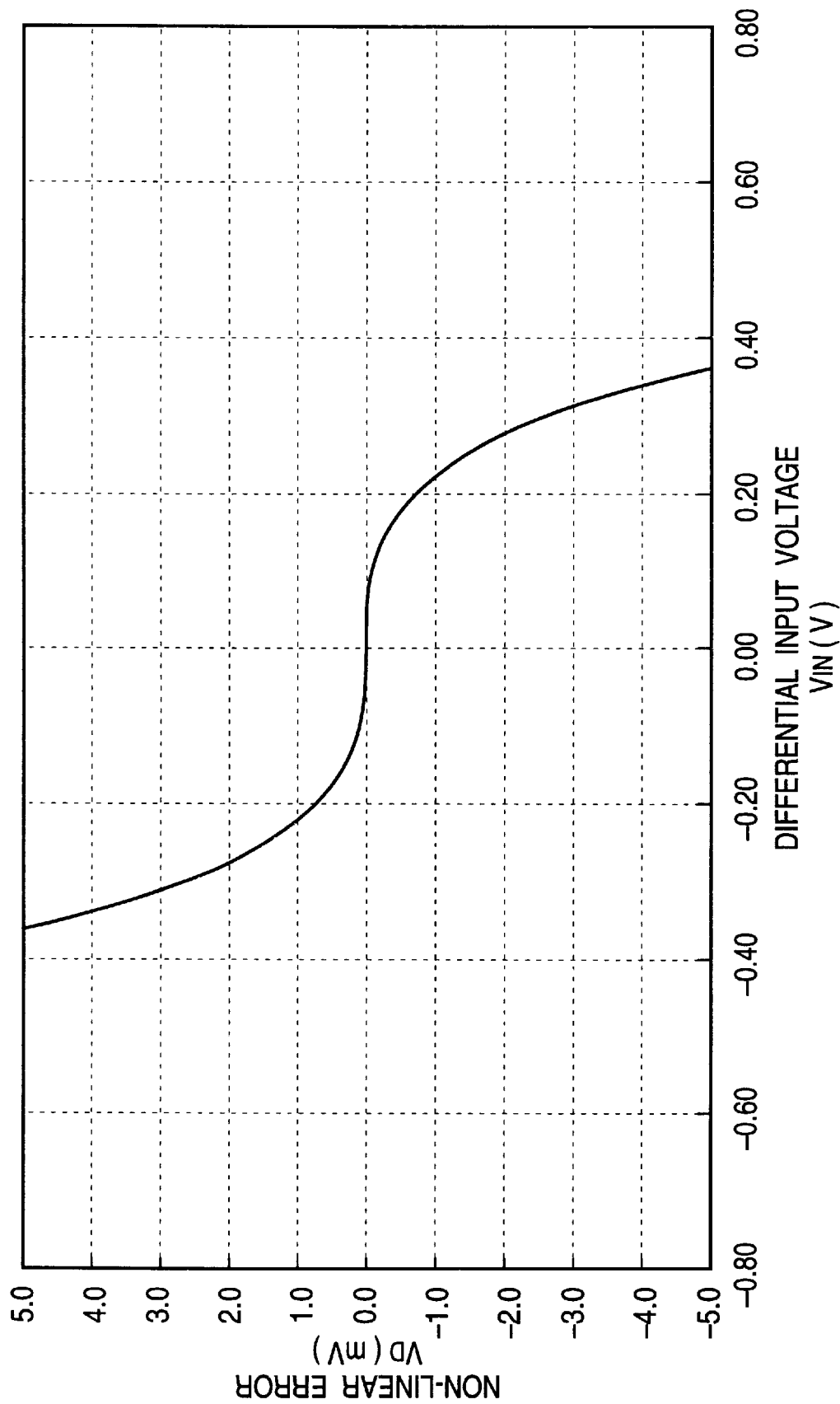
FIG. 9 is a graph illustrating a relation between a differential input voltage VIN and a non-linear error VD in the differential amplifier shown in FIG. 8, based on the SPICE simulation.
Figure 10:
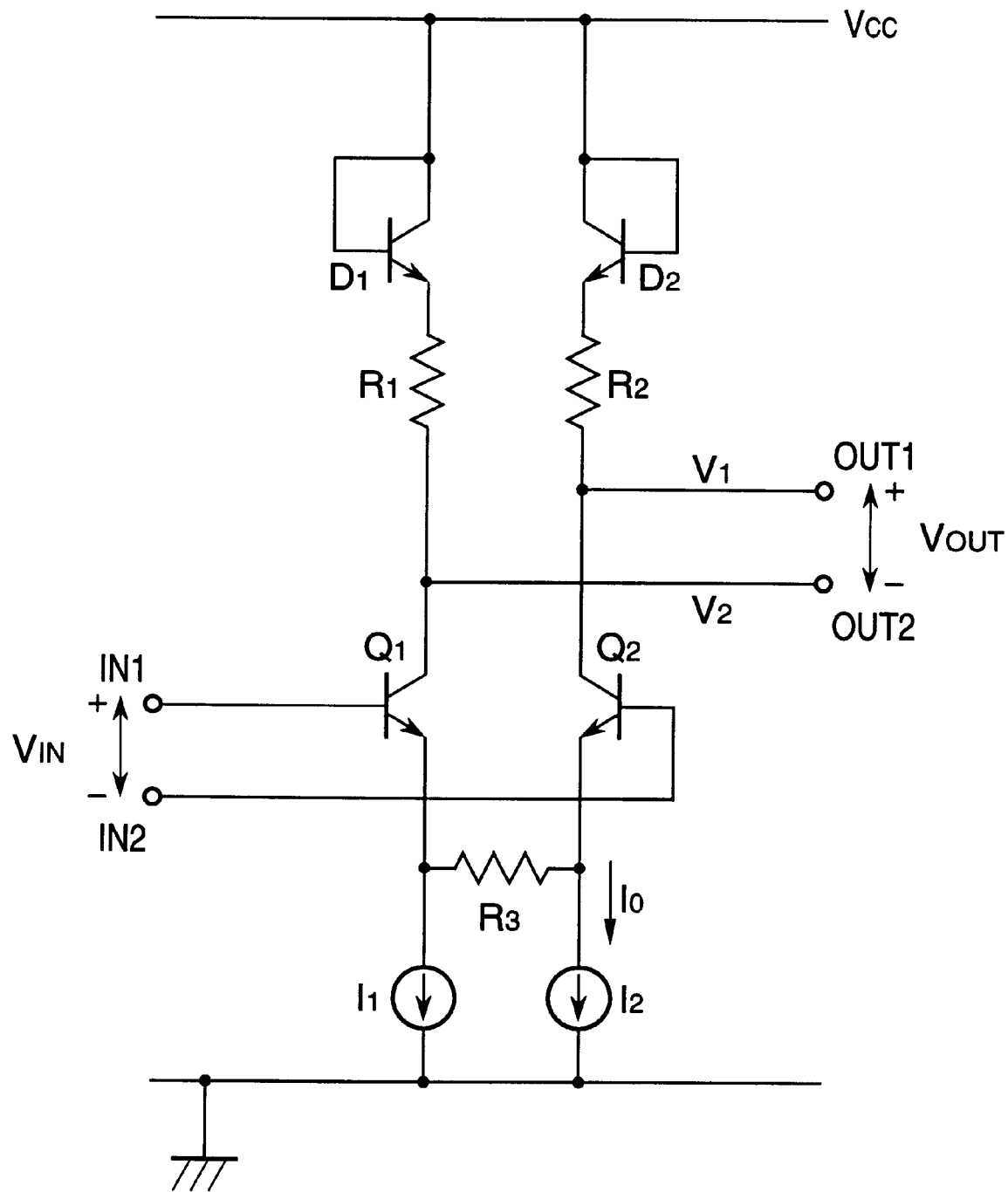
FIG. 10 is a circuit diagram illustrating another example of the prior art differential amplifier constituted of bipolar transistors.
Figure 11:
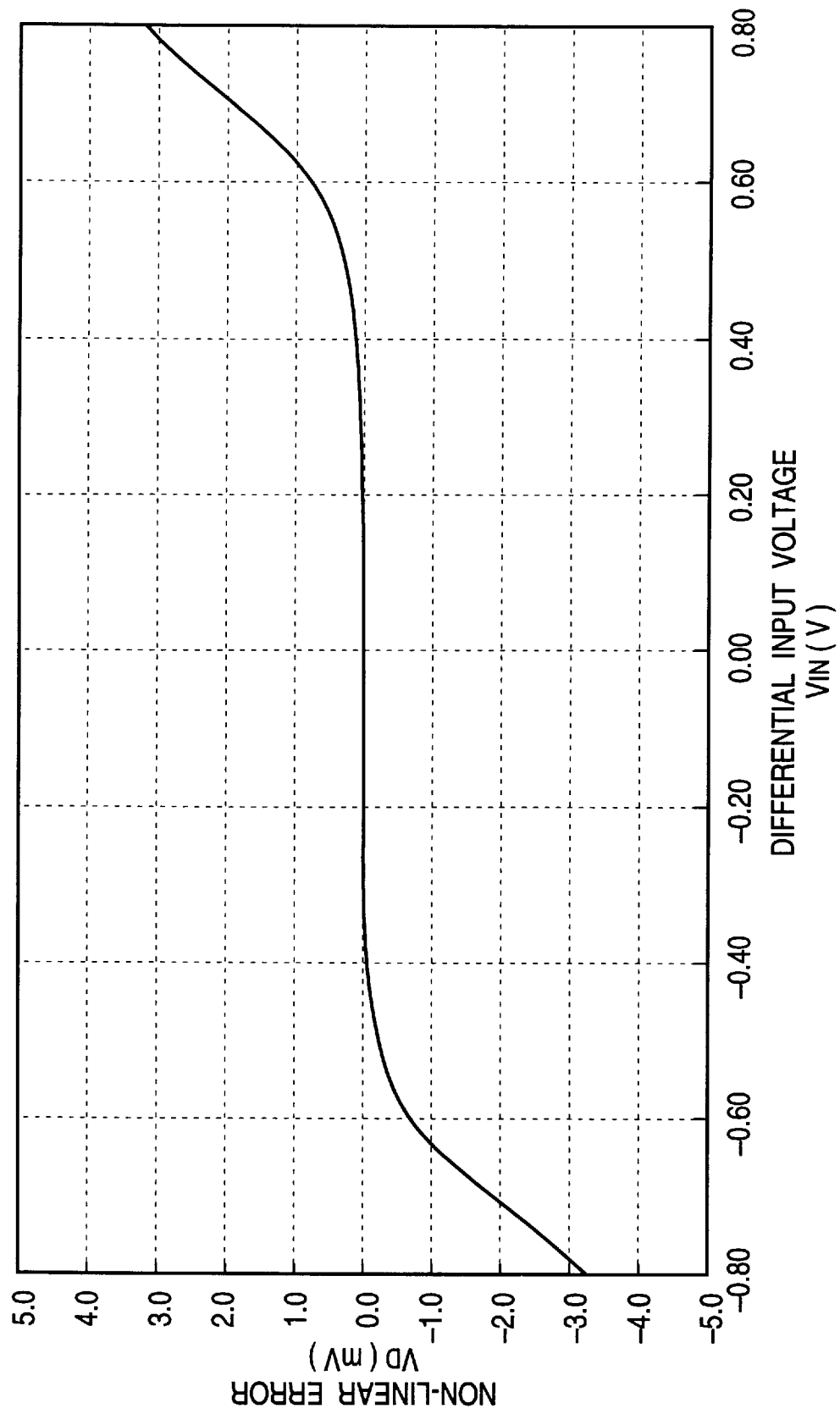
FIG. 11 is a graph illustrating a relation between a differential input voltage VIN and a non-linear error VD in the differential amplifier shown in FIG. 10, based on the SPICE simulation.

Referring to FIG. 7, there is shown a graph illustrating a relation between a differential input voltage VIN and a non-linear error VD in the differential amplifier shown in FIG. 6, based on the SPICE simulation.

As shown in FIG. 7, the linearly operating range was extended to ±470 mV. In addition, the gain was 0.9780, which is larger than that obtained in the prior art differential amplifier shown in FIG. 12.

As mentioned above, the differential amplifier in accordance with the present invention includes the base current compensating circuit for supplying at least a portion of each of base currents of the transistors of the second differential pair in the differential buffer and the transistors of the first differential pair in the first group of current sources. With this arrangement a current for reducing a non-linear distortion caused by base currents of said transistors of said second differential pair in said differential buffer and said transistors of said first differential pair in said first group of current sources, is supplied from the base current compensating circuit to said transistors of said second differential pair in said differential buffer and said transistors of said first differential pair in said first group of current sources, as a base current. Therefore, the differential amplifier operates linearly, and a widened linearly operating range and a high common-mode output potential are simultaneously realized.

The invention has thus been shown and described with reference to the specific embodiments. However, it should be noted that the present invention is in no way limited to the details of the illustrated structures but changes and modifications may be made within the scope of the appended claims.

I claim:

1. A differential amplifier comprising:

a non-linear distortion compensating circuit including a differential emitter follower, and a first group of current sources having a first differential pair of transistors having bases receiving a pair of emitter currents of said differential emitter follower, respectively, so that said first group of current sources are controlled by said pair of emitter currents of said differential emitter follower;

a differential buffer including a second differential pair of transistors having bases receiving signals outputted from said non-linear distortion compensating circuit, respectively, and a base current compensating circuit for supplying at least a portion of each of base currents of said transistors of said second differential pair in said differential buffer and said transistors of said first differential pair in said first group of current sources, wherein said base current compensating circuit is internally provided in said non-linear distortion compensating circuit, and further wherein said base current compensating circuit includes a current mirror circuit for supplying a predetermined base current to said transistors of said second differential pair in said differential buffer.

2. A differential amplifier claimed in claim 1 wherein said current mirror circuit has a magnifying power predetermined for eliminating a non-linear distortion caused by said base current.

3. A differential amplifier comprising:

a non-linear distortion compensating circuit including a differential emitter follower, and a first group of current sources having a first differential pair of transistors having bases receiving a pair of emitter currents of said differential emitter follower, respectively, so that said first group of current sources are controlled by said pair of emitter currents of said differential emitter follower;

a differential buffer including a second differential pair of transistors having bases receiving signals outputted from said non-linear distortion compensating circuit, respectively, and a base current compensating circuit for supplying to emitter nodes of said differential emitter follower, a current for reducing a non-linear distortion caused by base currents of said transistors of said second differential pair in said differential buffer and said transistors of said first differential pair in said first group of current sources, wherein said base current compensating circuit is internally provided in said non-linear distortion compensating circuit, and further wherein said base current compensating circuit includes a current mirror circuit for supplying a predetermined base current to said transistors of said second differential pair in said differential buffer.

4. A differential amplifier claimed in claim 3 wherein said current mirror circuit has a magnifying power predetermined for eliminating a non-linear distortion caused by said base current.

5. A differential amplifier comprising:

a non-linear distortion compensating circuit including a differential emitter follower, and a first group of current sources having a first differential pair of transistors having bases receiving a pair of emitter currents of said differential emitter follower, respectively, so that said first group of current sources are controlled by said pair of emitter currents of said differential emitter follower;

a differential buffer including a second differential pair of transistors having bases receiving signals outputted from said non-linear distortion compensating circuit, respectively, and a base current compensating circuit for supplying to emitter nodes of said differential emitter follower, a current for reducing a non-linear distortion caused by base currents of said transistors of said second differential pair in said differential buffer and said transistors of said first differential pair in said first group of current sources, wherein said base current compensating circuit includes a current mirror circuit for supplying a predetermined base current to said transistors of said second differential pair in said differential buffer.

6. A differential amplifier claimed in claim 5 wherein said current mirror circuit has a magnifying power predetermined for eliminating a non-linear distortion caused by said base current.

* * * * *